(12) United States Patent
Hapke

(10) Patent No.: US 7,143,322 B2
(45) Date of Patent: Nov. 28, 2006

(54) ARRANGEMENT AND METHOD OF TESTING AN INTEGRATED CIRCUIT

(75) Inventor: Friedrich Hapke, Winsen/Luhe (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 769 days.

(21) Appl. No.: 09/923,604

(22) Filed: Aug. 7, 2001

(65) Prior Publication Data

US 2002/0069027 A1 Jun. 6, 2002

(30) Foreign Application Priority Data

Aug. 10, 2000 (DE) ................ 100 39 004

(51) Int. Cl.
*G01R 31/28* (2006.01)
(52) U.S. Cl. ...................... 714/724; 714/25
(58) Field of Classification Search ............. 714/724
See application file for complete search history.

(56) References Cited

U.S. PATENT DOCUMENTS

| | | | | |
|---|---|---|---|---|
| 4,366,393 A | * | 12/1982 | Kasuya | 326/16 |
| 5,377,197 A | * | 12/1994 | Patel et al. | 714/724 |
| 5,677,916 A | * | 10/1997 | Nozuyama | 714/733 |

OTHER PUBLICATIONS

"Design of Scan-Based Path Delay Testable Sequential Circuits", Pramanick et al., Oct. 17-21, 1993, IEEE, International Test Conference, pp. 962-971.*

"Compact Two-Pattern Test Set Generation for Combinational and Full Scan Circuits", Hamzaoglu et al., Test Conference Proceedings, Oct. 18-23, 1998, pp. 944-953.*

* cited by examiner

*Primary Examiner*—Albert Decady
*Assistant Examiner*—John P. Trimmings

(57) ABSTRACT

In an arrangement for testing an integrated circuit comprising a combinational logic system, which arrangement performs a test of the behavior of the combinational logic system in comparison with test software which emulates the nominal behavior of the integrated circuit, the signal edge behavior of the combination logic system is checked in that that the test software comprises two identical software models of the combinational logic system to be tested, in which a test sample is applied for test purposes to a first of these software models and whose output signals are coupled to a second of these software models, in that the integrated circuit comprises a test circuit which, in a test mode, applies a first test sample in a first test clock cycle to the input of the combinational logic system of the integrated circuit and takes over the output signal in a buffer memory and which feeds back this output signal as a second test sample in a second test clock cycle to the input of the combinational logic system and again takes over the output signal of the combinational logic system in the buffer memory, and in that at the end of the second test clock cycle, the arrangement compares the results of the combinational logic system of the integrated circuit in the buffer memory with the results of the second software model.

3 Claims, 1 Drawing Sheet

ARRANGEMENT AND METHOD OF TESTING AN INTEGRATED CIRCUIT

Figure 1:
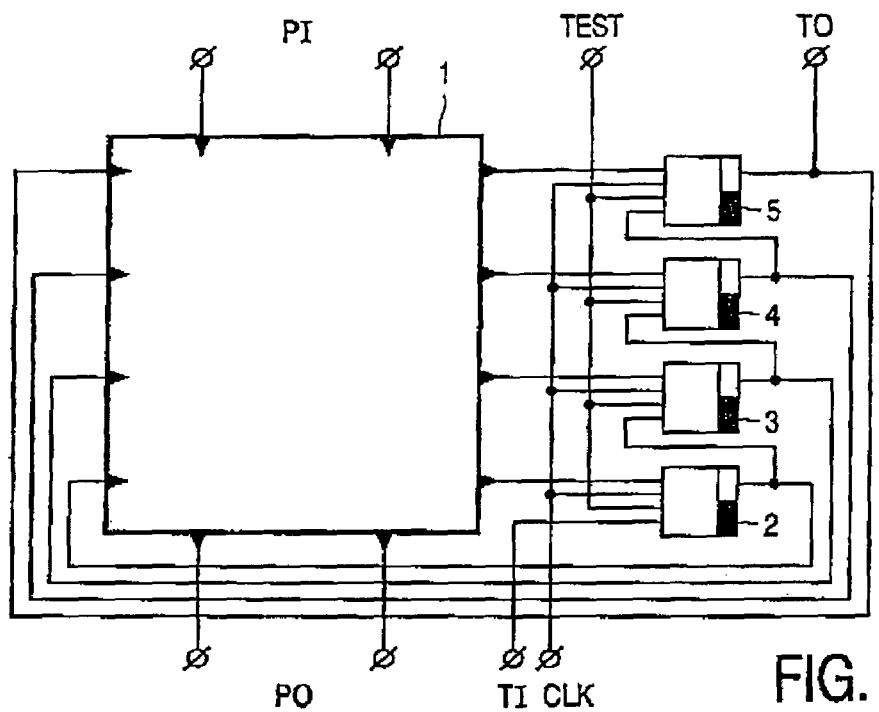

The invention relates to an arrangement and a method of testing an integrated circuit comprising a combinational logic system, which arrangement performs a test of the behavior of the combinational logic system in comparison with test software which emulates the nominal behavior of the integrated circuit.

Integrated circuits are usually tested after their manufacture, i.e. it is checked whether they operate as desired. A known method is the so-called stuck-at-error model. In this error model it is individually checked for each element of the combinational logic system whether its input and/or output has a too strong coupling with the positive power supply potential and/or the reference potential. This testing method is a more or less static method in which no edge transitions can be checked. This serious drawback is offset by the advantage that so-called combinational test sample generators can be used which have a relatively simple structure and mode of operation.

In the method known from the prior art, a so-called sequential test sample generator must be used when also edge transitions are to be checked, which generator checks, for example, in two test clocks, the states of the combinational logic system and thus also allows testing of edge transitions. The serious drawback of this solution is that such sequential test sample generators are very elaborate and therefore expensive. Furthermore, a very large number of test vectors must be generated for this test, so that also the test as such is elaborate. An example of a method using such a sequential test sample generator is known from U.S. Pat. No. 5,377,197.

It is an object of the invention to provide a test arrangement and a test method which can operate with a combinational test sample generator and, in addition, allows checking of edges in the combinational logic system.

For a testing arrangement according to the invention, this object is solved in that the test software comprises two identical software models of the combinational logic system to be tested, in which a test sample is applied for test purposes to a first of these software models and whose output signals are coupled to a second of these software models, in that the integrated circuit comprises a test circuit which, in a test mode, applies a test sample in a first test clock cycle to the input of the combinational logic system of the integrated circuit and takes over the output signal in a buffer memory, and which feeds back this test sample in a second test clock cycle to the input of the combinational logic system and again takes over the output signal of the combinational logic system in the buffer memory, and in that, at the end of the second test clock cycle, the arrangement compares the results of the combinational logic system of the integrated circuit in the buffer memory with the results of the second software model.

The integrated circuit comprising the combinational logic system to be tested, which may comprise circuit elements of different types such as, for example, gates and particularly comprise no memorizing components, is emulated by means of a software model. This software model can be run in a computer and is implemented in such a way that it emulates, i.e. copies the behavior, or more precisely the nominal behavior of the combinational logic system. An essential characteristic feature of the arrangement according to the invention is that this logic model of the combinational logic system is provided in a double form. Thus, more specifically, two identical consecutively arranged logic models of the combinational logic system to be tested are concerned. When a test sample is applied to the first software model, its output signals are applied as input signals to the second software model. The output signals of the second software model are evaluated for testing in a way to be further described.

The integrated circuit to be actually tested, i.e. the hardware, comprises a test circuit which can be activated in a test mode. The test circuit comprises a buffer memory used for running a test sample through the combinational logic system twice in succession. This is effected in that a test sample which is applied in a first test clock cycle to the input of the combinational logic system of the integrated circuit is taken over in the buffer memory at the end of this test clock. In a second test clock cycle, this result is again applied to the input of the combinational logic system and is available as a test result in the buffer memory at the end of this second test clock cycle. Also in the actual hardware, i.e. the combinational logic system in the integrated circuit, a test sample is passed through this logic system twice in succession and thereby changed.

Since in one test clock cycle a test sample is passed through the combinational logic system twice in succession both in the hardware and in the software model, their dynamic behavior, i.e. the edge behavior can be checked. In the first test clock cycle, given states are generated in the combinational logic system. These are replaced by new states in the second test clock cycle. By checking the states at the end of the second test clock cycle, it can thus be checked whether all elements of the combinational logic system have performed the change from the first state in the first test clock cycle to the state in the second test clock cycle.

To check the mode of operation of the integrated circuit and the combinational logic system provided in this circuit, the result of the buffer memory is compared in the integrated circuit with the result of the two consecutively arranged software models at the end of the second test clock cycle. This comparison directly shows whether the combinational logic system in the integrated circuit has the desired nominal behavior.

In the testing arrangement according to the invention, the test samples can be generated by means of a relatively simple combinational test sample generator. This results in a really reduced test effort and costs. Based on the above-described test clock cycles and the double software model, edges in the signals of the combinational logic system can still be tested.

In an embodiment of the invention as defined in claim 2, the buffer memory is constituted as a shift register by means of which the test samples are written and/or read. In this way, the buffer memory can take over data in parallel from the combinational logic system and apply them to the input of the combinational logic system, and it can serially write or read test samples.

According to the invention, the object is further solved for a testing method as defined in claim 3.

These and other aspects of the invention are apparent from and will be elucidated with reference to the embodiments described hereinafter.

Figure 2:
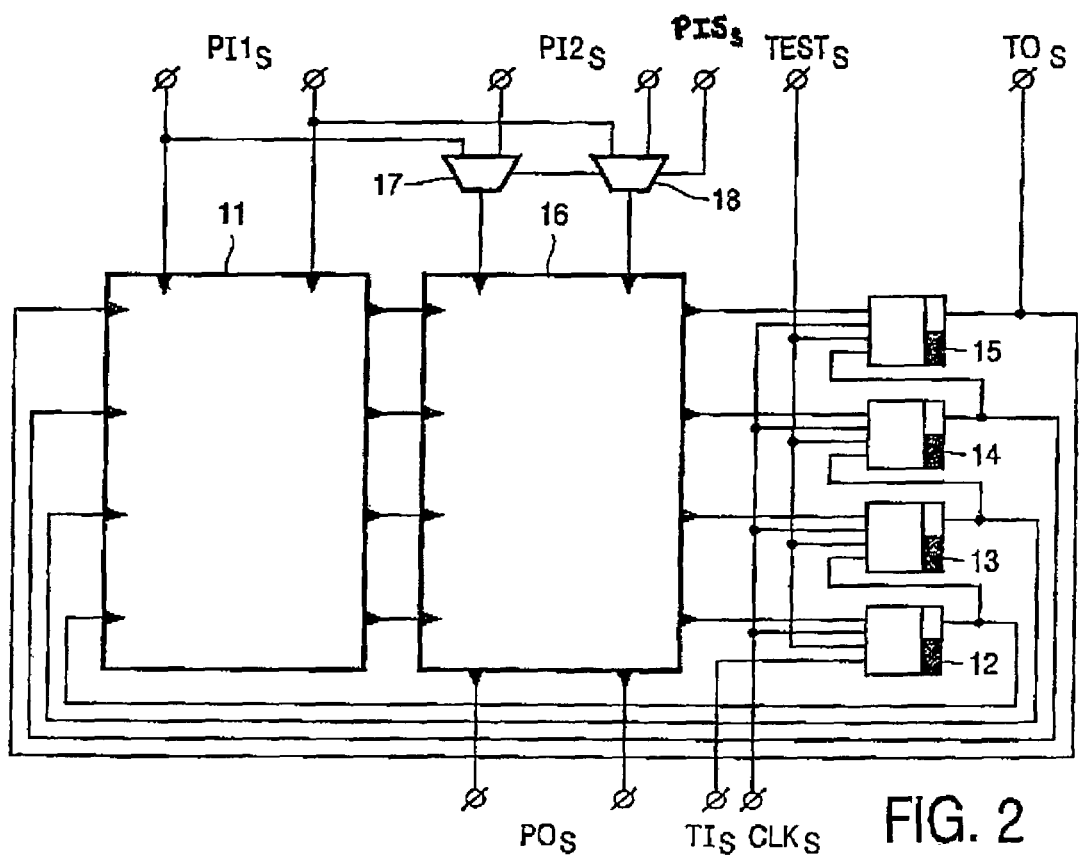

In the drawings:

FIG. 1 shows diagrammatically a combinational logic system to be tested, with a test circuit, and FIG. 2 shows diagrammatically test software in which the software model is present in a double form for emulating the combinational logic system of the integrated circuit of FIG. 1.

FIG. 1 diagrammatically shows elements of an integrated circuit. In the integrated circuit, particularly a combinational logic system 1 is to be checked. Such checking processes are useful after manufacture of the integrated circuit and the combinational logic system so as to check its correct behavior. This relates to the hardware, i.e. to the integrated circuits of the combinational logic system 1 obtained after the manufacturing process.

The integrated circuit comprises a test circuit consisting of flip-flops 2, 3, 4 and 5. These flip-flops are used as buffer memories for storing the test results of the combinational logic system 1 and for writing and reading test samples.

To this end, first inputs of the shift registers 2, 3, 4 and 5 are coupled to outputs of the combinational logic system 1. Data from the combinational logic system 1 are taken over via these first inputs during the tests. This is effected in dependence upon a clock signal CLK which is applied to a respective clock input of the flip-flops 2, 3, 4 and 5.

A test signal denoted by TEST in the Figure is applied to respective third inputs of the shift registers 2, 3, 4 and 5. By means of this test signal, the overall circuit can be set to a test mode in which the flip-flops 2, 3, 4 and 5 are switched to a fourth input from which they take over the data. The first flip-flop 2 takes over data of a test signal TI which is a test sample. The output of the flip-flop 2 is coupled to the second input of the flip-flop 3, the output of the flip-flop 3 is coupled to the second input of the flip-flop 4 and the output of the flip-flop 4 is coupled to the second input of the flip-flop 5. Thus, a shift register is obtained when the test signal TEST is activated. This shift register allows serial writing of TI data via the input into the chain of flip-flops 2, 3, 4 and 5 which constitute a shift register in this mode of operation. In a corresponding manner, data can also be read via this chain, which reading operation is performed via the output of the last flip-flop 5. This connection is denoted by TO in the Figure and allows reading of a test sample stored in the flip-flops 2 to 5.

The combinational logic system 1 further has inputs PI and outputs PO which are inputs and outputs provided for the actual application of the combinational logic system. They are also activated during testing, particularly data are thus applied to the inputs PI during testing.

The outputs of the flip-flops 2, 3, 4 and 5 are fed back to respective inputs of the combinational logic system 1.

According to the invention, the following events occur in the process of testing the circuit.

Initially, a test sample consisting of four bits in this example is written into the flip-flops 2, 3, 4 and 5 via the input TI in the case of an activated test signal TEST. This is done serially because in this state the flip-flops 2 to 5 constitute a kind of shift register. Subsequently, a test clock cycle is performed for testing the combinational logic system, during which cycle the test sample written into the shift register constituted by the flip-flops 2 to 5 is fed back to the inputs of the combinational logic system 1, passes through the combinational logic system 1 and is changed. The corresponding data are taken over in parallel in the flip-flops 2, 3, 4 and 5 at the end of this test clock cycle. Subsequently, these data, which are present at the outputs of the flip-flops 2 to 5, are run through the combinational logic system 1 again in a second test clock cycle. The data which are then changed again are again taken over in the flip-flops 2, 3, 4 and 5. Finally, these data are serially read via the test output TO.

As a result, a test sample will run through the combinational logic system twice in this manner. In the first test clock cycle, the elements of the combinational logic system will assume given states. Due to the second passage, these states are changed again. By checking the states at the end of the second test clock cycle, it can thus be checked whether the elements of the combinational logic system 1 to be checked have changed from the state at the end of the first test clock cycle to the nominal state at the end of the second test clock cycle.

Since only one test vector is provided for both test clock cycles, which vector consecutively runs through the combinational logic system twice, and since this test vector also needs to be read only once at the end of the second test clock cycle, a so-called combinational test sample generator may be used, which is relatively simple.

To check the test results, test software is provided which is shown diagrammatically in FIG. 2. The test software comprises a first software model 11 which emulates, i.e. imitates the behavior of the combinational logic system of the hardware, i.e. the combinational logic system 1 of FIG. 1. In FIG. 2 diagrammatically showing the software, a second software model 16 is provided which is identical to the first software model 11. This second software model thus similarly emulates the behavior of the combinational logic system 1 of the hardware shown in FIG. 1. The second software model 16 is preceded by the first software model 11, i.e. the input signals it takes over are the output signals of the first software model 11.

The software model of FIG. 2 also comprises flip-flops 12, 13, 14 and 15 which are arranged in the test software similarly as the hardware flip-flops of the circuit of FIG. 1. Also these flip-flops 12, 13, 14 and 15 in the software model allow a take-over of test samples from the software models, reading of these test samples in a software model and writing and reading test samples via a test input $TI_S$ and a test output $TO_S$.

The first software model 11 has primary inputs $PI1_S$ which correspond to the inputs PI of the combinational logic system 1 of FIG. 1. Similarly, the second software model 16 has a primary input $PI2_S$. The second software model 16, switched over by means of inultiplexers 17 and 18 and a switching signal $PI1_S$ applied thereto, may receive either the input signal $PI1_S$ or the input signal $PI2_S$. In the software model, these signals are of course used for testing. They are essential because these signals are superimposed on the test samples in the models of the combinational logic systems 11 and 16. The second software model 16 further has primary outputs $PO_S$.

The test run described above with reference to FIG. 1 for the hardware is performed similarly for the software of FIG. 2. First, a test sample is taken over via the test inputs $TI_S$ in the flip-flops 12, 13, 14 and 15. Subsequently, this test sample is run through the two software models 11 and 16. The output signal of the second software model 16 is then again taken over in the flip-flops 12, 31, 14 and 15 and aan be read via the test output $TO_S$.

Since the combinational logic system is provided as a double software model 11 and 16 in the test software of FIG. 2, no double passage by the software models is required in this case. In contrast, the second software model 16 supplies the nominal results after the two test clock cycles. These are compared with the results generated in the two test clock cycles in the hardware of FIG. 1, which results are finally readable via the test output TO of the circuit of FIG. 1.

Due to the fact that a test sample runs through the combinational logic system 1 of the hardware of FIG. 1 twice consecutively and that the software model of this combinational logic system in FIG. 2 is doubled in the form of software models 11 and 16, a test is possible in which a simple combinational test sample generator can be used and in which nevertheless a conclusion about the dynamic behavior, particularly the edge behavior of circuit elements of the combinational logic system 1 can be made. This is possible in that two states are generated one after the other in the combinational logic system 1 so that the transition from the first to the second state can be checked. This corresponds to checking the dynamic behavior or the edge behavior of circuit elements of the combinational logic system 1.

The invention claimed is:

1. An arrangement for testing an integrated circuit comprising a combinational logic system, and a test circuit, which arrangement performs a test of the behavior of the combinational logic system in comparison with test software which emulates the nominal behavior of the integrated circuit, the arrangement comprising:

two identical software models of the combinational logic system to be tested, in which a test sample is applied for test purposes to a first of these software models and whose output signals are coupled to a second of these software models;

wherein the test circuit, in a test mode, applies a first test sample in a first test clock cycle to the input of the combinational logic system of the integrated circuit and receives the output signal in a buffer memory, and which feeds back this output signal as a second test sample in a second test clock cycle to the input of the combinational logic system and again receives the output signal of the combinational logic system in the buffer memory wherein, at the end of the second test clock cycle, the arrangement compares the results of the combinational logic system of the integrated circuit in the buffer memory with the results of the second software model.

2. The arrangement as claimed in claim 1, characterized in that the buffer memory is constituted as a shift register by means of which the test samples are read and/or written.

3. A method of testing an integrated circuit comprising a combinational logic system, and a test circuit, in which method the behavior of the combinational logic system is compared with test software which emulates the nominal behavior of the integrated circuit, the method comprising:

providing two identical software models of the combinational logic system to be tested, in which a test sample is applied for test purposes to a first of these software models and whose output signals are coupled to a second of these software models;

wherein the test circuit, in a test mode, applies a first test sample in a first test clock cycle to the input of the combinational logic system of the integrated circuit and receives the output signal in a buffer memory and which feeds back this output signal as a second test sample in a second test clock cycle to the input of the combinational logic system and again receives the output signal of the combinational logic system in the buffer memory wherein, at the end of the second test clock cycle, the arrangement compares the results of the combinational logic system of the integrated circuit in the buffer memory with the results of the second software model.

* * * * *